(12) United States Patent
Schmezer

(10) Patent No.: US 11,770,052 B2
(45) Date of Patent: Sep. 26, 2023

(54) METHOD AND SYSTEM FOR EVALUATING THE VIBRATION BEHAVIOR OF AN ELECTRIC MOTOR

(71) Applicant: ZIEHL-ABEGG SE, Künzelsau (DE)

(72) Inventor: Joachim Schmezer, Niedernhall (DE)

(73) Assignee: ZIEHL-ABEGG SE, Künzelsau (DE)

( * ) Notice: Subject to any disclaimer, the term of this patent is extended or adjusted under 35 U.S.C. 154(b) by 494 days.

(21) Appl. No.: 17/261,024

(22) PCT Filed: May 29, 2019

(86) PCT No.: PCT/DE2019/200051
§ 371 (c)(1),
(2) Date: Jan. 17, 2021

(87) PCT Pub. No.: WO2020/015794
PCT Pub. Date: Jan. 23, 2020

(65) Prior Publication Data
US 2021/0320565 A1    Oct. 14, 2021

(30) Foreign Application Priority Data

Jul. 17, 2018 (DE) .......................... 102018211846.9

(51) Int. Cl.
*H02K 11/20* (2016.01)
*G01R 31/34* (2020.01)

(52) U.S. Cl.
CPC .......... *H02K 11/20* (2016.01); *G01R 31/343* (2013.01)

(58) Field of Classification Search
CPC ...... H02K 11/20; G01R 31/343; G01H 1/003; G01M 15/12
See application file for complete search history.

(56) References Cited

U.S. PATENT DOCUMENTS

| 6,199,018 B1 | 3/2001 | Quist |
| 6,262,550 B1 | 7/2001 | Kliman |

(Continued)

FOREIGN PATENT DOCUMENTS

| DE | 19702234 | 8/1998 |
| DE | 102007039699 | 2/2009 |

(Continued)

*Primary Examiner* — Emily P Pham
(74) *Attorney, Agent, or Firm* — FisherBroyles, LLP; Jason P. Mueller

(57) ABSTRACT

A method for evaluating a vibration behavior of an electric motor includes: determining a vibration value of the electric motor by measuring an acceleration and/or speed of vibrations of the electric motor using a vibration sensor of the electric motor, wherein vibrations are measured in at least one direction, said vibration value representing each of the at least direction measured, determining a current rotational speed (n) of the electric motor, comparing said vibration value with a reference value for the current rotational speed, and determining an evaluation measure for evaluating the vibration behavior of the electric motor based on the comparison of the vibration value with the reference value. Furthermore, a corresponding electric motor and a system consisting of the electric motor and a test system is disclosed with which the vibration behavior of the electric motor can be calibrated and reference values can be generated.

18 Claims, 3 Drawing Sheets

(56) References Cited

U.S. PATENT DOCUMENTS

Figure 1:
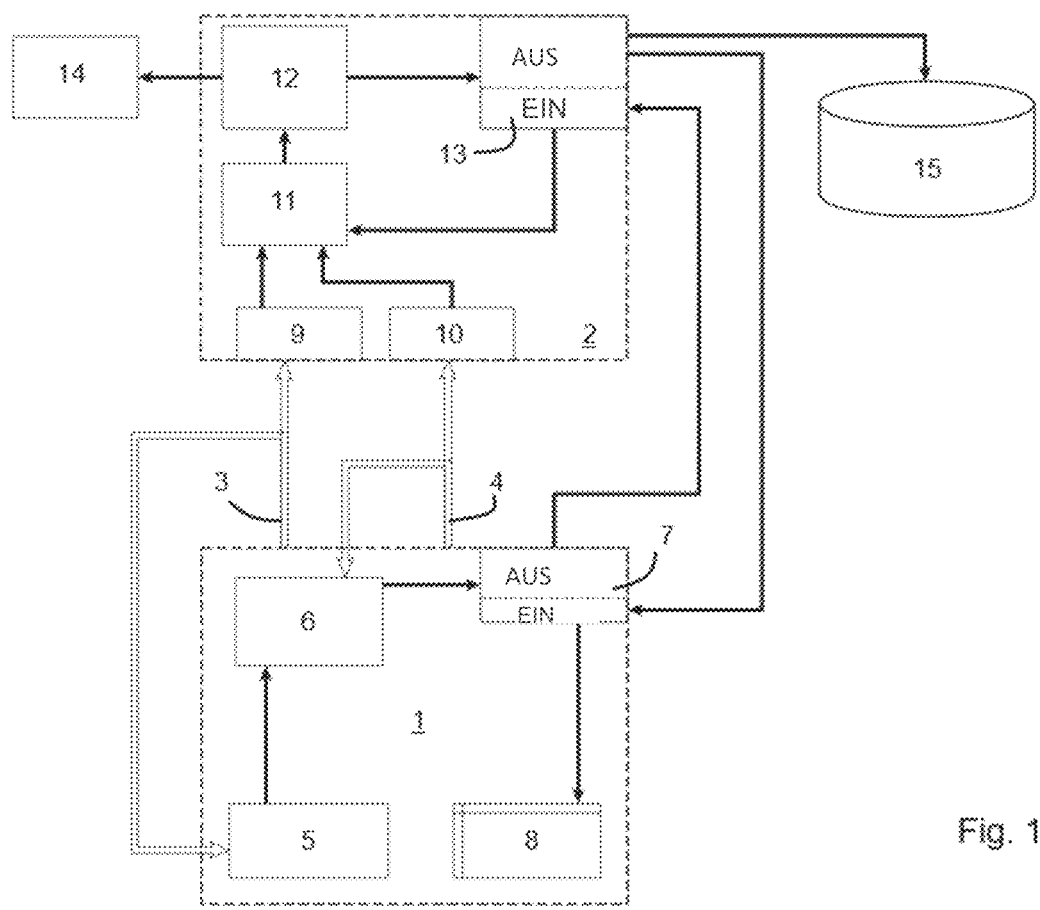

| | | |
|---|---|---|
| 6,484,109 B1 | 11/2002 | Lofall |
| 6,560,552 B2 | 5/2003 | Shen |
| 7,301,294 B2 * | 11/2007 | Ogino .................. H02P 6/17 |
| | | 318/400.03 |
| 2012/0330578 A1 | 12/2012 | Kar |
| 2013/0197740 A1 | 8/2013 | Hagel |
| 2015/0168268 A1 | 6/2015 | Fish |

FOREIGN PATENT DOCUMENTS

| | | |
|---|---|---|
| DE | 102011077490 | 12/2012 |
| DE | 102013102648 | 9/2014 |
| DE | 102007039699 B4 | 12/2017 |
| DE | 102019201409 | 8/2019 |
| DE | 102018211833 | 1/2020 |
| DE | 102018211838 | 1/2020 |
| EP | 2399104 | 12/2011 |
| EP | 2972431 | 1/2016 |
| RU | 2225537 C2 | 3/2004 |
| RU | 150618 U1 | 2/2015 |
| WO | 9823938 | 6/1998 |

* cited by examiner

METHOD AND SYSTEM FOR EVALUATING THE VIBRATION BEHAVIOR OF AN ELECTRIC MOTOR

This application is a national stage entry under 35 U.S.C. 371 of PCT Patent Application No. PCT/DE2019/200051, filed May 29, 2019, which claims priority to German Patent Application No. 10 2018 211 846.9, filed Jul. 17, 2018, the entire contents of each of which are incorporated herein by reference.

The disclosure relates to a method and a system for evaluating a vibration behavior of an electric motor. The disclosure further relates to an electric motor, and a fan with such an electric motor.

Electric motors are exposed to various types of vibrations, and vibrations during their operation. These vibrations can be caused by the electric motor itself, by the driven load or by the environment in which the electric motor is installed. For example, when the electric motor is a component of a fan, an imbalance of the impeller can generate a vibration. In addition, a non-uniform drive torque, which can arise, for example, from a pulsating DC link voltage, can further intensify the vibrations. If the fan is installed in an industrial environment that is also exposed to vibrations, further vibrations are generated.

Prior to delivery to the customer or prior to the installation in a housing, motors or fans are usually dynamically balanced by reducing non-symmetrical weight distributions or other vibration generating circumstances. However, damages can occur already during installation in a housing, transport to the customer, installation in a customer application or at the end customer, which damages can affect the balance quality. When a fan is operated in environments with adherent soiling, such as in agriculture or in severe corrosive environment, the balance quality is also affected by the service life of the fan.

Imbalances lead to increased vibrations, which in turn place a heavy load on the components of the electric motor. For example, the bearings are subjected to considerably more stress from vibrations than would be the case with a less vibrating system. On the other hand, the vibrations put a strain on the electronics that are integrated in the electric motor. This can lead to loosening of soldering, destruction of components or even breakage of circuit boards. Overall, a high level of vibration can cause the service life of the electric motor and/or its components to be significantly reduced.

EP 2972431 B1 discloses an electric motor with function monitoring of the motor bearings. For this purpose, a vibration sensor is attached to the stator flange on the side facing away from the rotor and measures vibrations of the electric motor. In this way it can be recognized if problems arise with the bearing of the electric motor. However, only limited statements can be made about the vibration behavior of the electric motor.

Therefore, disclosed is a method and a system of the type mentioned above, as well as to configure and develop an electric motor and a fan in such a way, that a reliable statement can be made about the vibration behavior of the electric motor.

According to various embodiments a method includes:
  determining a vibration value of the electric motor by measuring an acceleration and/or speed of vibrations of the electric motor by using a vibration sensor of the electric motor, wherein vibrations in at least one direction are measured and wherein the vibration value represents each of the measured at least one direction,
  determining a current rotational speed of the electric motor,
  comparing the vibration value with a reference value for the current rotational speed, and
  determining an evaluation measure for evaluating the vibration behavior of the electric motor based on the comparison of the vibration value with the reference value.

According to further embodiments, in addition to a stator and a rotor that is rotatably mounted relative to the stator, an electric motor further includes:
  a vibration sensor which is configured to measure vibrations of the electric motor in at least one direction,
  a rotational speed determination unit, which is configured to determine the current rotational speed of the electric motor,
  a comparator comparing vibration values determined by the vibration sensor with a reference value for the current rotational speed, and
  an evaluation unit which is configured to determine an evaluation measure for evaluating the vibration behavior based on a comparison result of the comparator.

A fan may include an electric motor and an impeller, the impeller being connected to the rotor of the electric motor.

In accordance with still further embodiments, a system includes:
  an electric motor,
  a test system configured for a variable rotational speed control of the electric motor and including at least one test sensor for measuring vibrations of the electric motor,
  wherein the electric motor is connected to the test system in such a way that vibrations of the electric motor can be measured by the at least one test sensor, and
  wherein the system is configured to measure vibrations using the at least one test sensor and the vibration sensor of the electric motor for several different rotational speeds of the electric motor.

Applicant has recognized that the vibration behavior of an electric motor can be evaluated when the vibration behavior is evaluated as a function of a current rotational speed of the electric motor. In this way, not only can resonance frequencies of the electric motor be identified, but also a limit load of the electric motor, for example as a result of excessive imbalance, can be recognized. For this purpose, a vibration value of the electric motor is measured by measuring an acceleration and/or a speed of vibrations of the electric motor. For this purpose, a vibration sensor is used that is integrated in the electric motor or vibrationally coupled to the electric motor. The vibration sensor measures vibrations in at least one direction. If vibrations are to be measured in only one direction, a simple one-axis sensor is sufficient. In the case of measurements in several directions, this can be achieved in that the vibration sensor is a multi-axis sensor. On the other hand, the vibration sensor could be formed by several individual sensors which measure vibrations in different directions. These measured values are used to generate a vibration value for the electric motor. The vibration value represents each of the measured at least one direction. This usually means that the vibration value is formed by a tuple of values, as is common with vectors, for example. However, there may also be applications in which the absolute values in the respective direction are not important. In such cases, the vibration value can also be formed by an amount for which, for example, the individual vibration values in the respective directions are added in the sense of a vector addition.

In a further step, the current rotational speed of the electric motor is determined. In this case, determining the speed and determining the vibration values should be performed close in time. It should be ensured that the determined rotational speed is actually current at the time of measuring the vibrations. For electric motors with low rotational speed variance determining the rotational speed can be performed at a relatively large time interval to measuring the vibrations. There can be several minutes or even hours between determining the rotational speed and measuring the vibrations. In most cases, however, the determination of the rotational speed and the measurement of the vibrations take place at short intervals, e.g., within 10 seconds, within 1 second, or within 0.1 seconds. To determine the current rotational speed, a dedicated rotational speed sensor can be used. On the other hand, the rotational speed can be derived from other quantities of the electric motor. A rotational speed value can be obtained from the motor electronics or derived from the frequency of the supply voltage. Appropriate methods for determining the rotational speed of an electric motors may be readily determined.

With the determined current rotational speed, a reference value is determined or loaded and compared with the specific vibration value. In this case, a list of reference values with the respective associated rotational speed can be stored in a memory and, based on the current rotational speed, a reference value can be loaded from the list. It would also be conceivable that the reference values are stored in a memory as function as a function of the rotational speed, wherein the function can be an approximation of the actual behavior and/or can be defined in sections. Determining the reference value would then include calculating the function with the current rotational speed as a variable. However, the reference value can also come from one or more test sensors of a test system, which measures the vibrations of the electric motor at the same time or close in time to the vibration sensor of the electric motor. In this way, a method can be used both in nominal operation of the electric motor and in calibration operation in a test system.

From the comparison of the determined vibration value and the (determined) reference value, an evaluation measure is determined which is representative of the vibration behavior of the electric motor. Based on this evaluation measure, it can be determined whether there is a critical vibration behavior of the electric motor or whether the electric motor is operated within acceptable vibrational limits. In this way, not only the vibration behavior triggered by the bearings can be assessed, but also the vibrations that are generated by the load, for example an impeller of a fan with an imbalance, or by the installation environment. Since during nominal operation of an electric motor, it is ultimately of secondary importance for an unacceptably high vibrational load of the electric motor, what causes the vibrations, the method can fully evaluate the vibration behavior of the electric motor.

When using the method during a calibration operation in a test system, the evaluation measure can indicate how vibrations of the electric motor affect the sensor signals of the vibration sensor of the electric motor and of the test sensor. The evaluation measure can indicate, for example, whether the vibration sensor of the electric motor is operating correctly and/or how individual vibrations impact the sensor signal of the vibration sensor of the electric motor and/or as vibration values can be placed in vibration levels or vibration zones and evaluated. This list shows how flexibly the evaluation measure can be used. In certain embodiments, information about the vibration behavior can be provided by the evaluation measure.

In principle, it is irrelevant for the method for which electric motor the method is used. In connection with some embodiments, a current rotational speed is determinable, which is the case with many electric motors. It is also important that a vibration sensor can be integrated into the electric motor or at least attached directly to it. However, the method is preferably used in connection with EC motors (electronically commutated motors).

The evaluation measure can in principle also be formed in the most varied of ways. It is important that the evaluation measure includes information about the vibration behavior of the electric motor. Since the vibration behavior in a nominal operation of the electric motor in many cases will be set in relation to a maximum permissible vibration value, the evaluation measure may indicate how far the vibration value diverges from a maximum permissible vibration value. How the evaluation measure looks in practice may depend on the particular application. It may be sufficient if a statement is made as to whether the maximum permissible vibration value has been reached or not. In this case, the evaluation measure can be formed by a simple binary statement. In most cases, however, it will be important how big the "distance" between the measured vibration value and the maximum permissible vibration value is. In these cases, the evaluation measure can be formed, for example, by an evaluation scale of natural numbers between 1 and 10 or a decimal number between 0 and 1 or a percentage between 0 and 100%. In this case, one of the boundary values can relate to the vibrations immediately after balancing, while the other boundary value—for example—indicates that the maximum permissible vibration value has been reached.

After the evaluation measure has been determined, there are various ways in which one can react to the evaluation of the vibration behavior. In principle, all reactions are conceivable that address the evaluated vibration behavior. In a development, however, a warning message is generated that indicates the reaching or exceeding a maximum permissible vibration value. How the warning message is output, in turn, depends on the respective application scenario. It would be conceivable, especially in Industry 4.0 environments, for a corresponding warning message to be sent over a network. This warning message can be received, for example, by maintenance personnel or operating personnel and appropriate countermeasures can be taken. A warning message can also be output by a simple light-emitting diode, for example, green in normal operation and red when reaching or exceeding the maximum permissible vibration value. It would also be conceivable here for the light-emitting diode to light up orange, for example, when a first vibration limit value is exceeded. A warning message can also be used—especially in the case of environments with adherent soiling—to trigger cleaning and/or maintenance work.

Alternatively or additionally, measures to protect the electric motor can be initiated when a maximum permissible vibration value is reached or exceeded. These measures can include, for example, changing the rotational speed of the electric motor. In most cases, reducing the rotational speed could help reduce the vibrations. In this way, the electric motor can be put in a less vibrating operational state. Another measure could include that the control is switched to a quieter mode of operation in which, for example, ripples in the drive torque are reduced to a greater extent. For this purpose, an evaluation unit, which determines the evaluation measure based on a comparison between the vibration value and the reference value, can be communicatively connected to the motor electronics.

Alternatively or additionally, the evaluation measure can be used to identify damage to the electric motor and/or the operated load. For example, the evaluation measure can be compared with one another for two successive activations of the electric motor. If the evaluation measures diverge from one another by more than a predetermined threshold value, there may be damage. In this way, for example, transport damage can also be detected. In this case, the two successive activations would be an operation during the final test of the electric motor and an initial start-up. Too large a deviation can be signaled by outputting a warning message and/or disallowing operation of the electric motor.

Alternatively or additionally, the evaluation measure can also be used to evaluate the vibrations of the installation environment. When the rotational speed of the electric motor is 0, the electric motor itself cannot generate any vibrations. All vibrations measured by the vibration sensor must therefore come from the installation environment (for example, heat exchanger, ventilation ducts, heat pump, air box housing etc.). The method can thus be used to detect and evaluate the vibrations of the installation environment. This evaluation can be stored in a memory and considered in operation of the electric motor. Such an evaluation of the installation environment can take place, for example, when a supply voltage is applied to the electric motor. Since the beginning of a rotation of the electric motors is delayed usually anyway by starting a motor electronics, a short additional delay for evaluating the vibration of the installation environment can be accepted. Furthermore, an evaluation during a stop of the motor (even without prior shutdown of the supply voltage) is possible. Here, it is conceivable that an evaluation is carried out after a specified time has passed. If the new evaluation is triggered, when the motor still runs, the evaluation can be postponed and carried out when the motor is stopped. If an evaluation of the vibrations of the installation environment results in a very high or too high vibration value, a warning message can be output and/or operation of the electric motor can be disallowed.

In a configuration of the vibration sensor, the vibration value is determined using a vibration sensor which is arranged in motor electronics of the electric motor. Many electric motors, in particular EC motors, have motor electronics that are required to control and/or regulate the electric motor. Such motor electronics generates, for example, the supply voltage for windings of the stator and/or rotor. Such an arrangement of a vibration sensor is described, for example, in DE 10 2018 211 838 A1, the content of which is hereby expressly referred to. In this case, said motor electronics can be arranged within the electric motor, for example in an electronics housing that is formed in a stator bushing. It is also conceivable that the motor electronics is arranged in a separate electronics housing and that this electronic housing is flanged or screwed to the electric motor. Also in this case, a vibration sensor that is arranged in the motor electronics is regarded as vibration sensor of the electric motor.

In another configuration of the vibration sensor, the vibration value is determined using a vibration sensor which is a component of a sensor arrangement that is arranged in a bearing tube of the electric motor. Many electric motors, especially medium or high performance electric motors (i.e. from about 100 W to 15 kW) have a bearing tube in which the shaft of the electric motor is rotatably mounted. Between the shaft and the wall of the bearing tube there is a gap that is frequently between 4 mm and 8 mm wide. This gap can be used for a sensor arrangement that causes operation parameters of the electric motor to be measurable. Such a sensor arrangement is described, for example, in DE 10 2018 211 833, the content of which is hereby expressly referred to.

The vibration sensor itself can be formed in the most varied of ways. In some embodiments, the vibration sensor is able to provide acceleration values and/or speed values for the measured vibration. The vibration sensor can be formed by a MEMS (Micro Electro-Mechanical System) acceleration sensor, a piezoelectric acceleration sensor, a microphone (for example a MEMS microphone) or strain gauges. Correspondingly suitable sensors may be readily obtained.

Depending on the type of evaluation of the vibration behavior of the electric motor, a measurement of vibrations in one or more directions can be appropriate. In some embodiments, however, vibrations are measured in three directions, each of which is taken into account in the vibration value. The three directions may be perpendicular to one another. These three directions, for example, can form a classic Cartesian coordinate system. In this case, for example, a first direction can be parallel to the axis of the electric motor, while one of the other directions is arranged parallel to a reference plane of the electric motor.

To obtain a picture as comprehensive as possible about the vibration behavior of the electric motor—especially in a nominal operation of the electric motor—the determination of the vibration value and the evaluation of the vibration behavior are performed repeatedly. The determination of the vibration value and the evaluation of the vibration behavior can be triggered by special events. Such an event can be, for example, turning on and starting up the electric motor, or a change in the rotational speed. In some embodiments the determination of the vibration value and the evaluation of the vibration behavior is performed periodically. This means that the execution of the steps is triggered at predefined time intervals. The period length, i.e., the time intervals, can depend on the respective application scenario. For example, as response to soiling on a fan impeller, it should be sufficient if the vibration behavior is evaluated daily, weekly or even monthly. In operating environments in which regular vibration changes and regular rotational speed changes are common, shorter period lengths should be appropriate. Here, for example, an hourly evaluation or an evaluation every few minutes would be conceivable.

In some embodiments, a determined vibration value and/or a determined evaluation measure are stored in a memory. In this way, the vibration value and/or the evaluation measure can be logged during operation. The memory can be buffered via an energy supply, for example a battery. However, a non-volatile memory such as, for example, a flash memory, an EEPROM (Electronically Erasable Programmable Read-Only Memory), an NVRAM (Non-Volatile Random Access Memory) or some other semiconductor memory may be used. When storing the vibration value and/or the evaluation measure, it is advisable to also store the current rotational speed at which the vibration value was recorded. In addition, it is advisable to store a time stamp indicating the date of recording the vibration value. A real-time clock is available for this purpose, which can supply data for a corresponding time stamp.

Additionally or alternatively, a determined vibration value and/or a determined evaluation measure can be transmitted via a communication interface. The communication interface can be implemented in various ways. Wireless transmission methods, for example radio-based or optical methods, can be used as well as wired methods. The transmission can be analog or digital, serial or parallel, packetized or in data streams, via a bus or direct connections. The transmission technology used in each case will depend on the respective application scenario. By way of example, but not limited, reference is made to Bluetooth, Bluetooth LE (Low Energy), NFC (Near Field Communication), Ethernet, RS485, Modbus, Profibus, CAN-Bus or USB (Universal Serial Bus). The communication interface may provide—directly or indirectly—access to a wide area network.

The communication interface can be connected communicatively to a motor electronics. In this case, the motor electronics may be configured to, based on vibration values and/or evaluation measures received via the communication interface, perform an adjustment of a control of the windings of the stator and/or rotor. For example, an evaluation measure can indicate that a high vibration load of the electric motor is present. In this case, the motor electronics can control the electric motor in such a way that the vibration load is reduced. This could be done by slightly changing the rotational speed of the electric motor to move the electric motor out of a resonance frequency, for example.

For determining a reference value, which can be used in a nominal operation of the electric motor, calibration and/or run-up measurements may be performed. In this case, the electric motor is operated at several different rotational speeds and vibrations of the electric motor are measured. For run-up measurements, the rotational speed may be continuously or quasi-continuously increased, allowing to find, for example, resonance frequencies particularly easily. In the calibration and/or run-up measurements, the vibrations are measured on the one hand with the vibration sensor of the electric motor and on the other hand with at least one test sensor. In this case, the at least one test sensor may be part of a test system. In this case, the at least one test sensor is coupled to the housing of the electric motor in such a way that vibrations of the electric motor can reach the test sensor in a defined manner. By the simultaneous recording with the vibration sensor of the electric motor a direct relationship can be established between the vibration sensor and the test sensor and evaluated with the method disclosed herein. Specifically, when the vibration sensor is imbedded in a casting compound, the vibrations of the electric motor reach the vibration sensor of the electric motor in a damped manner. By simultaneously measuring with the at least one test sensor a relationship can be established between the measured values of the vibration sensor and the measured values of the at least one test sensor. This relationship can then be reflected in the relevant reference value. Because depending on the damping behavior between the vibration sensor and the "rest" of the electric motor, the reference value will diverge to a different degree.

In addition to the determination of the reference values, a deviation value may be determined for different rotation speeds, indicating a relationship between a measured value of the vibration sensor of the electric motor and a measured value of the at least one test sensor. In a further development said deviation value can be used for adjusting the maximum permissible threshold value. In this way, the transmission characteristics of vibrations to the vibration sensor of the electric motor can be addressed.

In a further development, a reference characteristic curve containing several reference values at different rotational speeds of the electric motor, can be stored in a motor database. This motor database could contain operation parameters of several electric motors, each data set in the database mimicking the operational behavior of the respective associated dedicated electric motor ("digital twin"). Such a database system is described, for example, in DE 10 2018 201 707 A1.

An electric motor includes—in addition to a stator and a rotor—a vibration sensor, a rotational speed detection unit, a comparator and an evaluation unit, and is configured for performing the method. The vibration sensor is configured to measure vibrations of the electric motor in at least one direction. The rotational speed determination unit is configured to determine the current rotational speed of the electric motor. The comparator compares the vibration values determined using the vibration sensor with a reference value and outputs the comparison result to the evaluation unit which is configured to determine an evaluation measure for evaluating the vibration behavior based on the comparison result. It should be pointed out that these components do not necessarily have to be made available exclusively for the evaluation of the vibration behavior. Rather, components can also be used that are already available for other purposes. For example, the rotational speed determination unit for the motor control can be provided in order to be able to generate a suitable control for the windings of the rotor and/or the stator. Furthermore, for example, the evaluation unit or the comparator may be implemented in a micro-controller of the motor control.

The electric motor may include an interface configured for exchanging vibration values and/or calibration vibration values with a test system. In this way, a measurement of the electric motor can be favored in a calibration and/or run-up measurement. The interface may again be formed in different ways. Wireless interfaces can be used as well as wired ones. Since the electric motor is operated in the test system in a wired manner anyway, a wired interface lends itself for this purpose.

Figure 2:
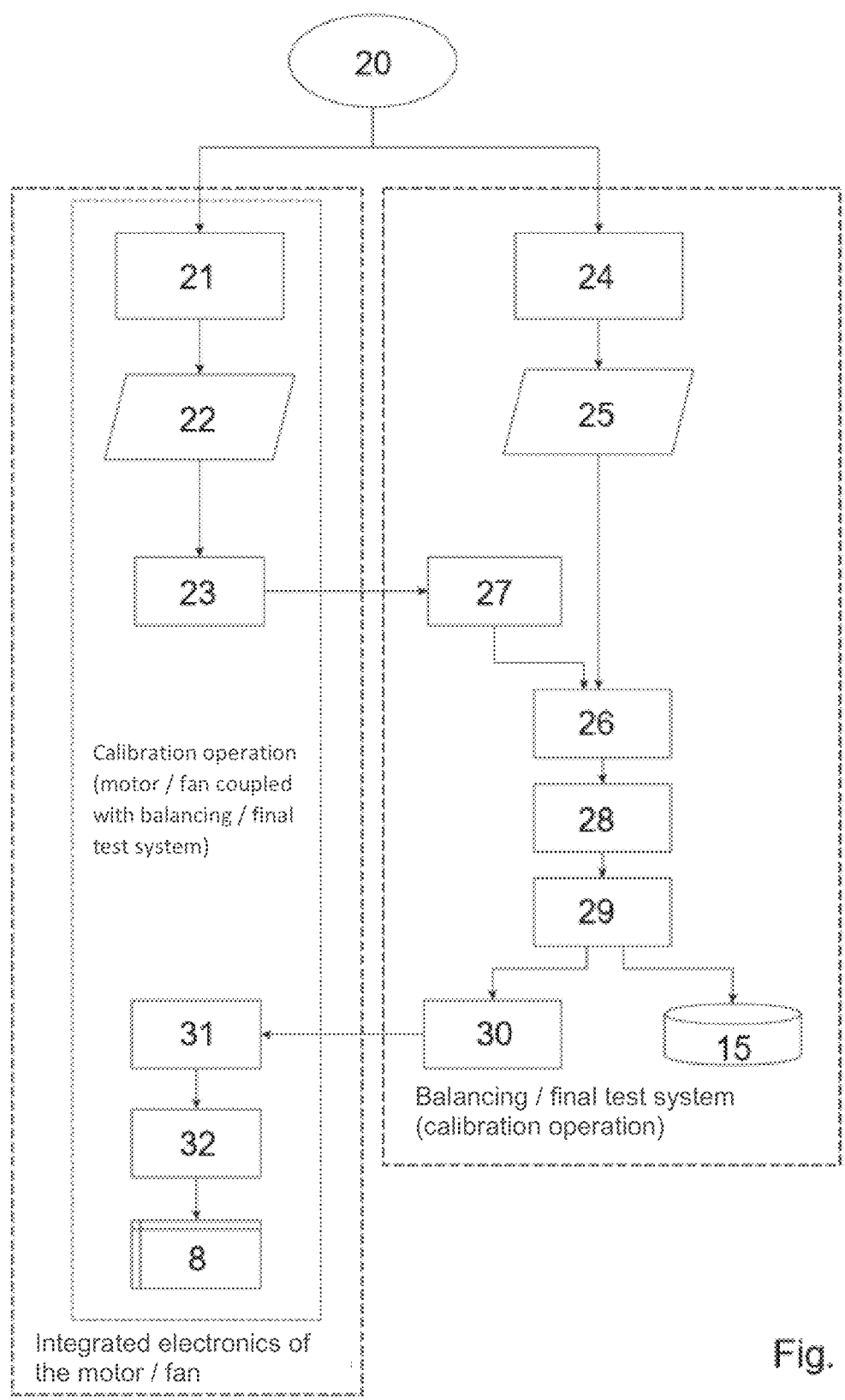
Figure 3:
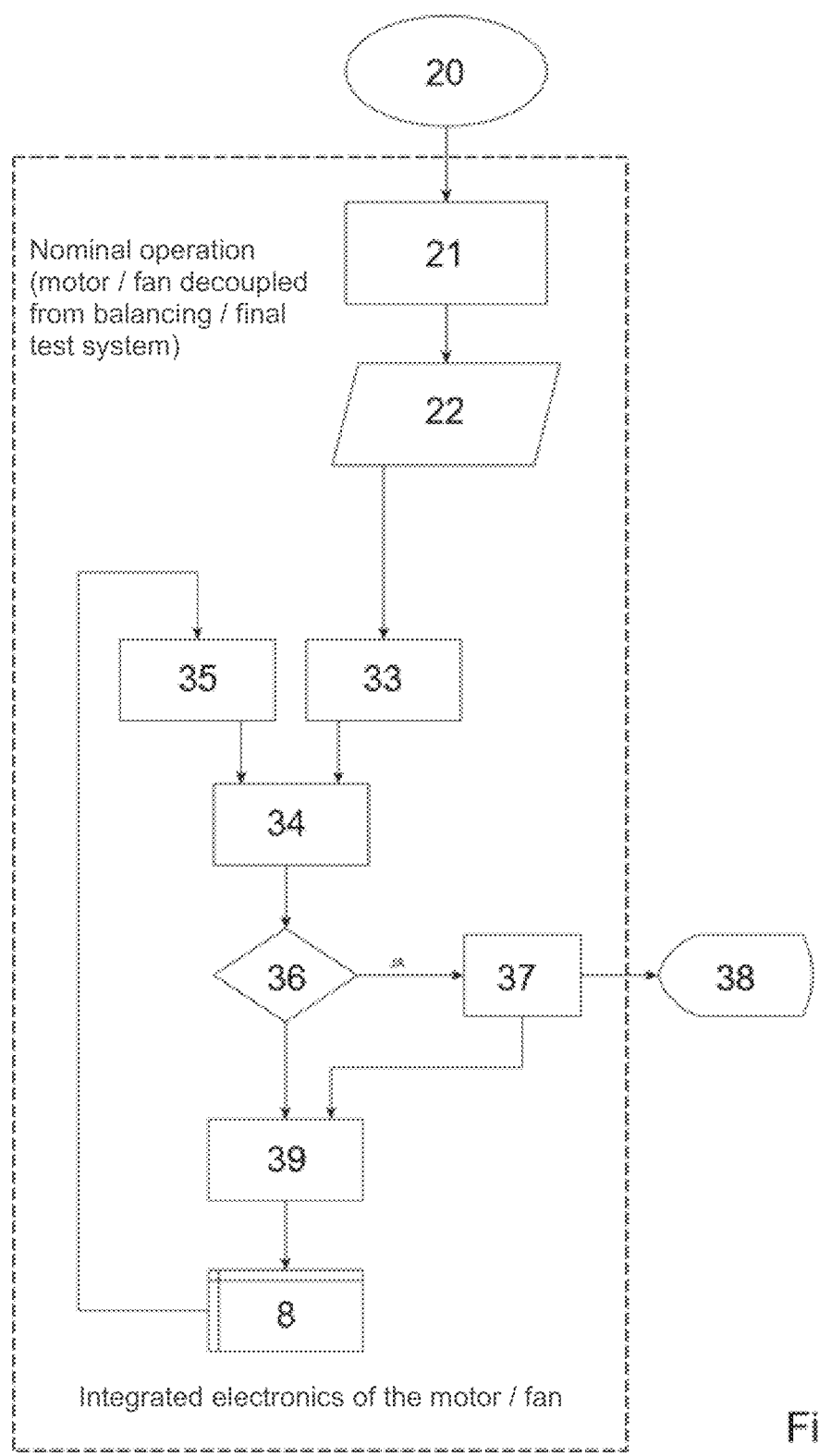

There are now various possibilities for configuring and developing the the various embodiments disclosed herein in an advantageous manner. For this purpose, reference is made on the one hand to the dependent claims of the independent claims and on the other hand to the following explanation of exemplary embodiments with reference to the drawing. In connection with the explanation of the embodiments with reference to the drawing, example configurations and further developments of the teaching are explained. In the drawings, FIG. 1 shows a block diagram with an electric motor and a test system as well as the interaction between these components, FIG. 2 shows a flow chart of a method for evaluating the vibration behavior of an electric motor during a calibration operation, and FIG. 3 shows a flow chart of a method for evaluating the vibration behavior of an electric motor during a nominal operation.

FIG. 1 shows a block diagram with a system made up of an electric motor 1 and a test system 2, with the components most relevant to the method being shown in FIG. 1. The electric motor 1 is part of a fan and generates vibrations when operating, which is shown by arrow 3, and a rotational speed, which is illustrated by arrow 4. The vibrations 3 are measured by an (internal) vibration sensor 5 of the electric motor in at least one direction. The measured values determined by the vibration sensor 5 are transferred to a processor 6, which is formed, for example, by a micro-controller. This processor 6 can, for example, carry out an analog-digital conversion and/or control the collection of the measured values. The processor 6 can thus determine vibration values from the measured values. In addition, a program is executed by the processor 6, which program functions as an evaluation unit and calculates an evaluation measure. In addition, the processor 6 is configured to determine the current rotational speed.

The processor 6 is connected to an interface 7 and an (internal) memory 8. The interface 7 represents a communication connection to the test system 2. Information can be sent to the test system 2 via an output OUT of the interface 7, information can be received form the test system 2 via an input IN of the interface 7, wherein the input channel and the output channel not necessarily have to be implemented separately, but can also use a common communication line, for example, using a bus. The memory 8 is used to store reference values and/or determined vibration values and/or determined evaluation measures.

The test system 2 includes at least one test sensor 9, a rotational speed sensor 10, a data collection unit 11, a processor 12 and an interface 13. The at least one test sensor 9 is configured to measure the vibrations 3 of the electric motor 1. For this purpose, the at least one test sensor 9 is vibrationally coupled to the electric motor. The rotational speed sensor 10 measures the current rotational speed 4 of the electric motor 1. Both the test sensor/s 9 and the rotational speed sensor 10 transfer measured values to the data collection unit 11 which, in turn, can pass information to the processor 12. The processor 12 is connected to a data output unit 14 such that, for example, a balance can be indicated or results of a final test can be output. The processor is also connected to interface 13 which, like interface 7, includes an input IN and an output OUT. The input IN of the interface 13 is communicatively connected to the output OUT of the interface 7, while the output OUT of the interface 13 is communicatively connected to the input IN of the interface 7. In addition, the input IN of the interface 13 is connected to the data collection unit 11 and the output OUT of the interface 13 is connected to a database 15 representing a motor database for storing operation parameters of the electric motor 1.

An exemplary behavior of the system illustrated in FIG. 1 is illustrated in FIG. 2 as a flow diagram. In an initial step 20, the electric motor is operated at a rotational speed n. Here, the electric motor 1 generates vibrations that are represented by a vibration value S—e.g., a multidimensional quantity. After step 20, the flow diagram branches into a part that runs on the test system and a part that runs on the electric motor or its motor electronics.

In step 21, vibration values of the motor are collected with the vibration sensor 5 of the electric motor 1 in the integrated electronics of the electric motor/fan. Simultaneously, the current rotational speed of the electric motor is determined, which can be carried out by reading out a corresponding memory value. In step 22, a value pair $W_{motor}$ is generated with the vibration value S and the associated rotational speed, which pair is then transferred in step 23 to the test system 2 via the interface 7. At the same time, in step 24, the vibrations 3 of the electric motor 1 are measured using the at least one test sensor 9. The vibration values obtained in this way are then combined in step 25 with the current rotational speed in a value pair $W_{test\ system}$. This value pair $W_{test\ system}$ is transferred to the processor 12 in step 26 together with the value pair $W_{motor}$ collected essentially at the same time. The value pair $W_{motor}$ was transferred to the test system in step 27 via the connection between the interfaces 7 and 13 from step 23. In step 28, the value pairs $W_{motor}$ and $W_{test\ system}$ are compared with each other so that the measured values of the test sensor 9 represent a reference value in terms of the method. In step 29, a calibration of the vibration values at the same rotational speed is carried out. This may include determining a deviation value and/or an evaluation measure. The vibration values at the same rotational speed $W_{motor}$ and $W_{test\ system}$ can then be stored as reference values in database 15 and transferred to electric motor 1 via interface 13 in step 30. In the electric motor, the reference values and/or the deviation values are transferred from the interface 7 in step 31, and are stored in the internal memory 8 in step 32.

By repeatedly carrying out these processes at different rotational speeds, reference characteristic curves of the electric motor and the test system can be recorded, and a group of reference values and their associated rotational speeds can be stored in the internal memory 8 of the electric motor and database 15. In this way, a lookup table can be created that can be used when the method is later used in "normal" operation of the electric motor.

The vibration values of the motor or fan collected by the test sensor 9 can be used for the evaluation and classification in vibration levels or vibration zones. By matching the measured values of the internal sensor 5 and of the test sensor 9, conclusions can be drawn concerning the actually present vibrations without coupling with a test system in the further use of the motor and an evaluation of the present vibration level can be carried out in a customer application.

In addition, the calibration measurement on the test stand shows whether the function of the vibration sensor 5 of the electric motor 1 and the associated measured value collection and measured value processing components is available and whether plausible measured values are generated because they are compared with the vibration values of the test system.

In addition, vibration measurement values of a rotor (with no associated stator) can be collected during balancing of the rotor in a "dummy" stator by a test sensor of a balancing system and during calibration on the test system can be passed on as an additional value pairs or as a characteristic curve to the database or to the internal memory of the motor electronics. This information can be used to filter out and evaluate the vibration influence of attachments in a customer application.

In FIG. 3, the electric motor or its motor electronics is decoupled from the test system. This means that these steps can be executed in "normal" operation of the electric motor, for example, in a customer system. The steps can be triggered periodically. Here, too, in an initial step 20, the electric motor is operated at a rotational speed n. The electric motor 1 generates vibrations that are represented by a vibration value S—e.g., a multidimensional quantity. In the subsequent step 21, vibration values of the motor are collected with the vibration sensor 5 of the electric motor. In step 22, a value pair $W_{motor}$ is generated using the vibration value S and the associated rotational speed and passed to step 33, in which the value pair $W_{motor}$ is made available to a comparator. In step 34 this value pair $W_{motor}$ is compared with a reference value which is loaded from the memory 8 in step 35. The comparator is implemented in the processor 6.

The result of comparing the value pair $W_{motor}$ with the reference value is analyzed in step 36 using an evaluation unit and an evaluation measure is generated. The evaluation measure is configured here as a binary quantity which indicates whether a maximum permissible vibration value has been exceeded or not. If the limit value for a maximum permissible vibration value is exceeded, measures to protect the electric motor and/or the environment are taken in step 37, which can consist, for example, in the output of a warning message or a rotational speed reduction (step 38). At the same time, this event can be stored in memory 8 together with the associated measured values in step 39. If the maximum permissible vibration value has not been reached, the value pair $W_{motor}$, the comparison result and/or other quantities are stored in memory 8 in step 39.

In a normal motor operation—also called nominal operation—the result to the comparator indicates how much the vibrations have increased since the last calibration measurement. Therefore, the comparison in step 34 should provide an even greater value, the more the vibrations have increased relative to the calibration measurement. In this respect, this comparison result can be compared with a limit value for a maximum permissible vibration and an excessive vibration behavior of the electric motor can be derived therefrom. It is immaterial whether the vibrations originate from the electric motor itself, the impeller driven by the electric motor, a non-ideal control of the electric motor or the installation environment of the electric motor.

With regard to further advantageous configurations of the various disclosed embodiments, to avoid repetitions, reference is made to the general part of the description as well as to the accompanying claims.

Finally, it should be explicitly noted that the above-described exemplary embodiments merely serve to explain the claimed teaching, but do not limit said teaching to said exemplary embodiments.

LIST OF REFERENCE NUMERALS 1 electric motor
2 test system
3 vibrations
4 rotational speed
5 vibration sensor
6 processor
7 interface
8 memory
9 test sensor
10 rotational speed sensor
11 data collection unit
12 processor
13 interface
14 data output unit
15 database

The invention claimed is:

1. A method for evaluating vibration behavior of an electric motor, the method comprising:
determining a vibration value of the electric motor by measuring at least one of an acceleration and speed of vibrations of the electric motor using a vibration sensor of the electric motor, wherein vibrations in at least one direction are measured and the vibration value represents each of the measured at least one directions;
determining a current rotational speed of the electric motor;
comparing the vibration value with a reference value for the current rotational speed; and
determining an evaluation measure for evaluating the vibration behavior of the electric motor based on the comparison of the vibration value with the reference value.

2. The method of claim 1, wherein the evaluation measure indicates how far the vibration value is away from a maximum permissible vibration value.

3. The method of claim 1, wherein upon reaching or exceeding a maximum permissible vibration value, further comprising at least one of:
generating a warning message; and
introducing measures to protect the electric motor.

4. The method of claim 1, wherein the vibration sensor of the electric motor is used to determine the vibration value, the vibration sensor being arranged in motor electronics of the electric motor.

5. The method of claim 1, wherein the vibration sensor of the electric motor is used to determine the vibration value, the vibration sensor being part of a sensor arrangement arranged in a bearing tube of the electric motor.

6. The method of claim 1, wherein determining the vibration value comprises measuring vibrations of the electric motor along three mutually perpendicular directions.

7. The method of claim 1, wherein determining the vibration value and evaluating the vibration behavior are performed periodically.

8. The method of claim 1, wherein at least one of the vibration value and the evaluation measure are stored in a memory.

9. The method of claim 1, wherein at least one of the vibration value and the evaluation measure are transmitted via a communication interface.

10. The method of claim 1, wherein the reference value is determined at several different rotational speeds of the electric motor during a calibration measurement or during a run-up measurement, the vibrations of the electric motor being measured with the vibration sensor of the electric motor and with at least one test sensor, the at least one test sensor being a component of a test system.

11. The method of claim 10, further comprising determining a deviation value that represents a relationship between measured values of the vibration sensor of the electric motor and measured values of the at least one test sensor, wherein the deviation value is used to adjust a maximum permissible vibration value.

12. The method of claim 10, further comprising storing a reference value characteristic curve for several reference values at different rotational speeds of the electric motor in a motor database, wherein the motor database comprises operation parameters for plural electric motors.

13. The method of claim 1, further comprising comparing the evaluation measures at two successive activations of the electric motor, wherein the compared evaluation measures in excess of a predetermined threshold are indicative of possible damage.

14. The method of claim 1, wherein the evaluation measure is determined based on the evaluation of the vibration behavior for an installation environment of the electric motor when a rotational speed of the electric motor is zero.

15. An electric motor configured to carry out the method of claim 1, the electric motor comprising:
a stator;
a rotor rotatably mounted relative to the stator;
the vibration sensor configured to measure vibrations of the electric motor in at least one direction;
a rotational speed determination unit configured to determine the current rotational speed of the electric motor;
a comparator for comparing vibration values determined by the vibration sensor of the electric motor with the reference value for the current rotational speed; and
an evaluation unit configured to determine the evaluation measure for evaluating the vibration behavior based on a comparison result of the comparator.

16. The electric motor of claim 15, further comprising an interface configured to exchange at least one of the vibration values and calibration vibrations values with a test system.

17. A fan comprising the electric motor of claim 15, the electric motor further comprising an impeller, wherein the impeller is connected to the rotor.

18. A system for evaluating vibration behavior of the electric motor of claim 15, the system comprising:
- a test system configured to variably control a rotational speed of the electric motor, the test system comprising at least one test sensor for measuring vibrations of the electric motor, wherein the electric motor is connected to the test system such that the vibrations of the electric motor can be measured by the at least one test sensor, and the system is configured to measure vibrations using the at least one test sensor and the vibration sensor of the electric motor at different rotations speeds of the electric motor.

* * * * *